(12) United States Patent
Zundel et al.

(10) Patent No.: US 12,136,670 B2
(45) Date of Patent: Nov. 5, 2024

(54) SEMICONDUCTOR DEVICE HAVING CONTACT TRENCHES EXTENDING FROM OPPOSITE SIDES OF A SEMICONDUCTOR BODY

(71) Applicant: Infineon Technologies AG, Neubiberg (DE)

(72) Inventors: Markus Zundel, Egmating (DE); Andreas Meiser, Sauerlach (DE); Hans-Peter Lang, Munich (DE); Thorsten Meyer, Regensburg (DE); Peter Irsigler, Obernberg/Inn (AT)

(73) Assignee: Infineon Technologies AG, Neubiberg (DE)

( * ) Notice: Subject to any disclaimer, the term of this patent is extended or adjusted under 35 U.S.C. 154(b) by 342 days.

(21) Appl. No.: 17/824,198

(22) Filed: May 25, 2022

(65) Prior Publication Data

US 2022/0285550 A1    Sep. 8, 2022

Related U.S. Application Data

(63) Continuation of application No. 16/235,550, filed on Dec. 28, 2018, now abandoned, which is a (Continued)

(51) Int. Cl.
*H01L 21/74* (2006.01)
*H01L 21/02* (2006.01)
(Continued)

(52) U.S. Cl.
CPC .......... *H01L 29/7813* (2013.01); *H01L 21/02* (2013.01); *H01L 21/743* (2013.01); *H01L 21/762* (2013.01); *H01L 21/76224* (2013.01); *H01L 21/823475* (2013.01); *H01L 23/48* (2013.01); *H01L 27/0629* (2013.01); *H01L 27/0694* (2013.01); *H01L 29/06* (2013.01);
(Continued)

(58) Field of Classification Search
None
See application file for complete search history.

(56) References Cited

U.S. PATENT DOCUMENTS 5,293,056 A    3/1994  Terashima
6,150,708 A    11/2000 Gardner et al.
(Continued)

FOREIGN PATENT DOCUMENTS

CN   101794781 A   8/2010
DE   10333556 B4   7/2006
(Continued)

OTHER PUBLICATIONS

Humpston, G., et al., "Principles of Soldering", Materials Park, OH: ASM International, 2004, 161-162.

*Primary Examiner* — Bilkis Jahan
(74) *Attorney, Agent, or Firm* — Murphy, Bilak & Homiller, PLLC

(57) ABSTRACT

A method of manufacturing a semiconductor body includes forming a pattern at a first side of a substrate, forming a semiconductor layer on the first side of the substrate, attaching the substrate and the semiconductor layer to a carrier via a surface of the semiconductor layer, and removing the substrate from a second side opposite to the first side.

12 Claims, 10 Drawing Sheets

Related U.S. Application Data continuation of application No. 15/051,105, filed on Feb. 23, 2016, now abandoned, which is a continuation of application No. 13/589,717, filed on Aug. 20, 2012, now Pat. No. 9,281,359.

(51) Int. Cl.

| | | |
|---|---|---|
| *H01L 21/762* | (2006.01) | |
| *H01L 21/8234* | (2006.01) | |
| *H01L 23/48* | (2006.01) | |
| *H01L 27/06* | (2006.01) | |
| *H01L 29/06* | (2006.01) | |
| *H01L 29/417* | (2006.01) | |
| *H01L 29/423* | (2006.01) | |
| *H01L 29/45* | (2006.01) | |
| *H01L 29/66* | (2006.01) | |
| *H01L 29/78* | (2006.01) | |
| *H01L 29/861* | (2006.01) | |
| *H01L 29/40* | (2006.01) | |

(52) U.S. Cl.
CPC ...... *H01L 29/417* (2013.01); *H01L 29/41741* (2013.01); *H01L 29/41766* (2013.01); *H01L 29/4236* (2013.01); *H01L 29/456* (2013.01); *H01L 29/66477* (2013.01); *H01L 29/66727* (2013.01); *H01L 29/66734* (2013.01); *H01L 29/78* (2013.01); *H01L 29/7803* (2013.01); *H01L 29/7827* (2013.01); *H01L 29/7845* (2013.01); *H01L 29/861* (2013.01); *H01L 21/823418* (2013.01); *H01L 29/0657* (2013.01); *H01L 29/407* (2013.01); *H01L 2924/0002* (2013.01)

(56) References Cited

U.S. PATENT DOCUMENTS

| | | |
|---|---|---|
| 6,373,097 B1 | 4/2002 | Werner |
| 6,639,301 B2 | 10/2003 | Andoh |
| 7,199,402 B2 | 4/2007 | Andoh |
| 7,923,330 B2 | 4/2011 | Weber |
| 7,943,955 B2 | 5/2011 | Haeberlen et al. |
| 2002/0070380 A1 | 6/2002 | Andoh |
| 2002/0127890 A1 | 9/2002 | Andoh |
| 2005/0104134 A1 | 5/2005 | Kato |
| 2005/0118816 A1 | 6/2005 | Hirler et al. |
| 2005/0156283 A1 | 7/2005 | Tokuda et al. |
| 2005/0258442 A1 | 11/2005 | Seo et al. |
| 2006/0286729 A1 | 12/2006 | Kavalieros et al. |
| 2007/0072324 A1* | 3/2007 | Krames ............ C30B 29/403 |
| | | 257/E33.028 |
| 2007/0215938 A1 | 9/2007 | Yanagida et al. |
| 2008/0023772 A1 | 1/2008 | Kawakita |
| 2008/0296675 A1 | 12/2008 | Yanagida et al. |
| 2009/0014787 A1 | 1/2009 | Wang |
| 2009/0085104 A1 | 4/2009 | Weber |
| 2009/0108457 A1 | 4/2009 | Christensen et al. |
| 2009/0269896 A1 | 10/2009 | Chen et al. |
| 2010/0133616 A1 | 6/2010 | Frank et al. |
| 2010/0193835 A1 | 8/2010 | Hshieh |
| 2010/0276728 A1 | 11/2010 | Hsieh |
| 2011/0095358 A1 | 4/2011 | Micciche' et al. |
| 2011/0114965 A1* | 5/2011 | Letertre ............ H01L 21/76254 |
| | | 438/479 |
| 2011/0133272 A1 | 6/2011 | Mauder et al. |
| 2012/0012924 A1 | 1/2012 | Meiser et al. |
| 2012/0012928 A1 | 1/2012 | Lim et al. |
| 2012/0126318 A1 | 5/2012 | Kadow et al. |
| 2012/0146133 A1 | 6/2012 | Hirler et al. |

FOREIGN PATENT DOCUMENTS

| | | |
|---|---|---|
| DE | 10345447 B4 | 4/2007 |
| DE | 102010000208 A1 | 1/2011 |
| WO | 0024060 A2 | 4/2000 |

* cited by examiner

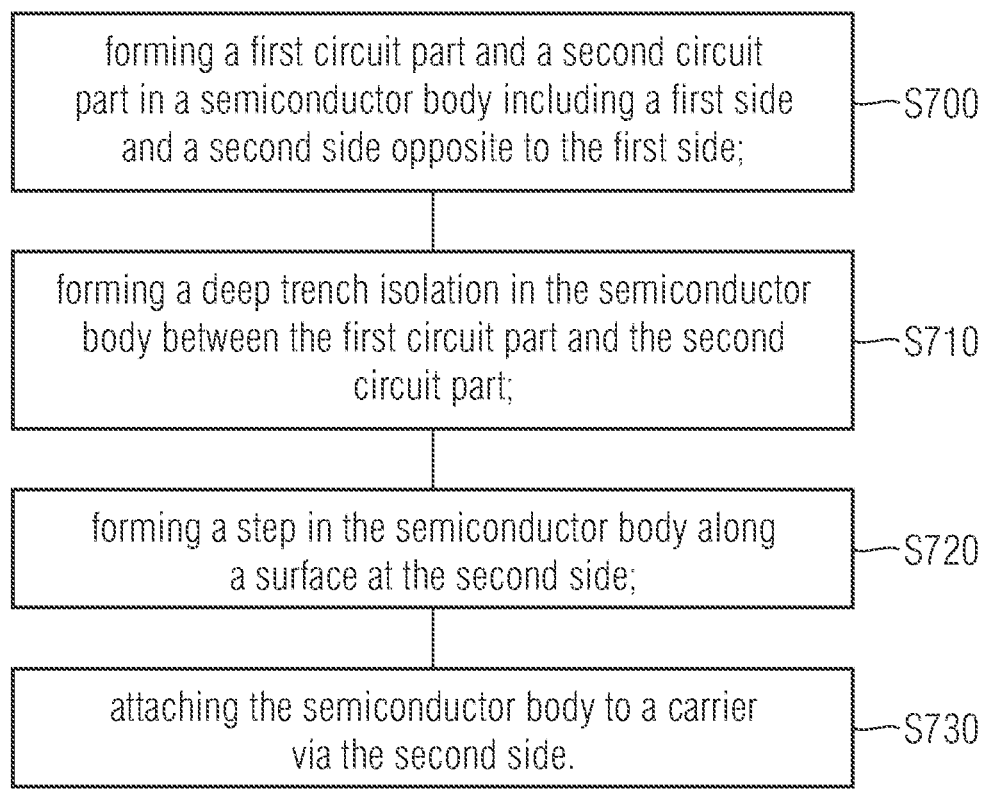

SEMICONDUCTOR DEVICE HAVING CONTACT TRENCHES EXTENDING FROM OPPOSITE SIDES OF A SEMICONDUCTOR BODY

RELATED APPLICATIONS

This application is a continuation of and claims priority to U.S. patent application Ser. No. 16/235,550 filed on Dec. 28, 2018, which in turn is a continuation of and claims priority to U.S. patent application Ser. No. 15/051,105 filed on Feb. 23, 2016, which in turn is a continuation of and claims priority to U.S. application Ser. No. 13/589,717 filed on Aug. 20, 2012.

BACKGROUND

Semiconductor devices and integrated circuits are formed in semiconductor bodies, e.g. semiconductor substrates including optional semiconductor layer(s) thereon. As an example, processes such as ion implantation, layer deposition and etching allow for introducing functional regions, e.g. n- and p-doped regions and dielectrics into the semiconductor body. Semiconductor devices and integrated circuits are limited with regard to reliability and functionality per chip area. Hence, there is a need for an improved solution.

SUMMARY

According to an embodiment of a semiconductor device, the semiconductor device includes a semiconductor body including a first side and a second side opposite to the first side. The semiconductor device further includes a first contact trench extending into the semiconductor body at the first side. The first contact trench includes a first conductive material electrically coupled to the semiconductor body adjoining the first contact trench. The semiconductor device further includes a second contact trench extending into the semiconductor body at the second side. The second contact trench includes a second conductive material electrically coupled to the semiconductor body adjoining the second contact trench.

According to another embodiment of a semiconductor device, a semiconductor body includes a first side and a second side opposite to the first side, a first dielectric disposed on the first side, a second dielectric disposed on the second side, one or more FET devices disposed at the first side, a first contact trench extending through the first dielectric at the first side, a first conductive material disposed in the first contact trench and electrically connected to the semiconductor body, a second contact trench extending through the second dielectric and into the semiconductor body at the second side, and a second conductive material disposed in the second contact trench and electrically connected to the semiconductor body at sidewalls of the second contact trench.

According to another embodiment of a semiconductor device, a semiconductor body includes a first side and a second side opposite to the first side, the semiconductor body comprising a semiconductor material of a first conductivity type, a gate formed at the first side, a first contact trench extending through a first dielectric and into the semiconductor body at the first side, wherein the first contact trench includes a first conductive material electrically connected to the semiconductor body adjoining the first contact trench via sidewalls of the first contact trench, a second contact trench extending through a second dielectric and into the semiconductor body at the second side, wherein the second contact trench includes a second conductive material, a first contact pattern laterally completely surrounded by the first dielectric at the first side, and a second contact pattern laterally completely surrounded by the second dielectric at the second side. Lower sidewall portions of the second contact trench that extend between the second side and a bottom side of the contact trench directly interface with the semiconductor body. The second conductive material is electrically connected to the semiconductor body via the lower sidewall portions of the second contact trench. The second conductive material is electrically connected to a first semiconductor region of the first conductivity type via the lower sidewall portions of the second contact trench. The second conductive material is electrically connected to a second semiconductor region of a second conductivity type via the bottom side of the second contact trench.

According to another embodiment of a semiconductor device, a semiconductor body includes a first side and a second side opposite to the first side, the semiconductor body comprising a semiconductor material of a first conductivity type, a gate formed at the first side, a first contact trench extending through a first dielectric and into the semiconductor body at the first side, wherein the first contact trench includes a first conductive material electrically connected to the semiconductor body adjoining the first contact trench via sidewalls of the first contact trench, a second contact trench extending through a second dielectric and into the semiconductor body at the second side, wherein the second contact trench includes a second conductive material, a first contact pattern laterally completely surrounded by the first dielectric at the first side, and a second contact pattern laterally completely surrounded by the second dielectric at the second side. Lower sidewall portions of the second contact trench that extend between the second side and a bottom side of the contact trench directly interface with the semiconductor body. The second conductive material is electrically connected to the semiconductor body via the lower sidewall portions of the second contact trench. The second conductive material is electrically connected to a first semiconductor region of a second conductivity type via the lower sidewall portions of the second contact trench. The second conductive material is electrically coupled to a second semiconductor region of the first conductivity type via the bottom side of the second contact trench.

According to an embodiment of an integrated circuit, the integrated circuit includes a semiconductor body including a first side and a second side opposite to the first side. The semiconductor body further includes a first circuit part and a second circuit part electrically insulated via a deep trench isolation. The semiconductor body is attached to a carrier via the second side. The semiconductor body further includes a step along a surface at the second side.

According to an embodiment of a method of manufacturing an integrated circuit, the method includes forming a first circuit part and a second circuit part in a semiconductor body including a first side and a second side opposite to the first side. The method further includes forming a deep trench isolation in the semiconductor body between the first circuit part and the second circuit part. The method further includes forming a step in the semiconductor body along a surface at the second side. The method further includes attaching the semiconductor body to a carrier via the second side.

According to a method of manufacturing a semiconductor body, the method includes forming a pattern on a first side of a substrate. The method further includes forming a semiconductor layer on the first side of the substrate. The method further includes attaching the substrate and the semiconductor layer to a carrier via a surface of the semiconductor layer. The method further includes removing the substrate from a second side opposite to the first side.

According to a method of manufacturing a semiconductor device, the method includes forming a gate dielectric and a gate electrode at a first side of a semiconductor body. The method further includes forming at least one first conductive layer at a second side of the semiconductor body opposite to the first side. The method further includes forming a conductive layer pattern on the at least one first conductive layer, wherein a thickness of the conductive layer pattern is adjusted between 0.5 μm and 50 μm.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description. The elements of the drawings are not necessarily to scale relative to each other. Like reference numerals designate corresponding similar parts.

FIG. 7 is a simplified flow chart of a method of manufacturing an integrated circuit according to an embodiment.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims.

The drawings are not scaled and are for illustrative purposes only. For clarity, corresponding elements have been designated by the same references in the different drawings if not stated otherwise.

Terms such as "first", "second", and the like, are used to describe various elements, regions, sections, etc. and are also not intended to be limiting. Like terms refer to like elements throughout the description.

The terms "having", "containing", "including", "comprising" and the like are open and the terms indicate the presence of stated structures, elements or features but not preclude additional elements or features.

The articles "a", "an" and "the" are intended to include the plural as well as the singular, unless the context clearly indicates otherwise.

The Figures illustrate relative doping concentrations by indicating "−" or "+" next to the doping type "n" or "p". For example, "n⁻" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1:
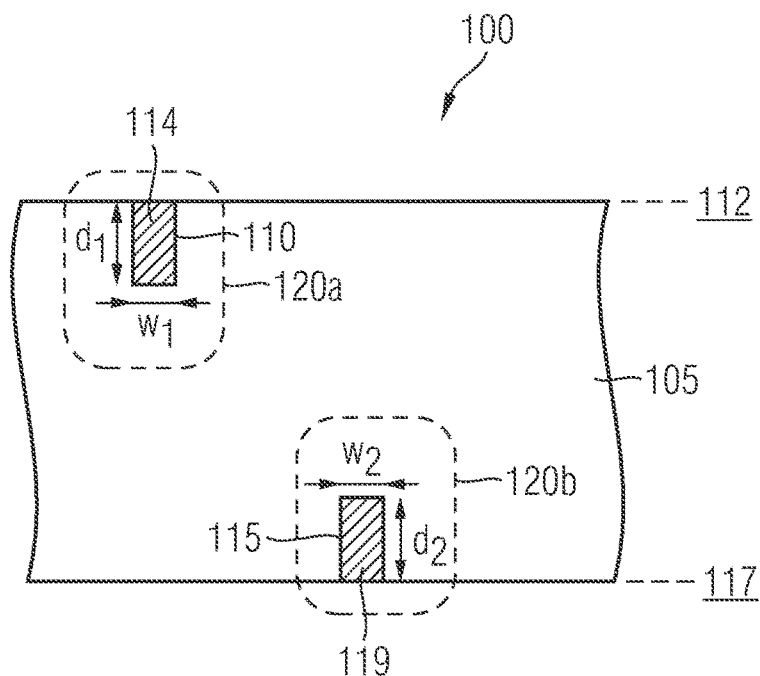
FIG. 1 is a schematic and simplified cross-sectional view of a portion of a semiconductor device including a first contact trench at a first side of a semiconductor body and a second contact trench at a second side of the semiconductor body.

FIG. 1 is a schematic and simplified cross-sectional view of a portion of a semiconductor device 100 according to an embodiment. The semiconductor device 100 includes a semiconductor body 105. According to an embodiment, the semiconductor body 105 is a monocrystalline silicon substrate. According to other embodiments, the semiconductor substrate 105 includes other semiconductor materials, e.g. SiC or GaN. The semiconductor body 105 may further include none, one or a plurality of semiconductor layers, e.g. epitaxial semiconductor layer on the semiconductor substrate.

The semiconductor device 100 further includes a first contact trench 110 at a first side 112, e.g. front side of the semiconductor body 105 and a second contact trench 115 at a second side 117, e.g., the back side of the semiconductor body 105.

The first contact trench 110 includes a first conductive material 114 and the second contact trench 115 includes a second conductive material 119. The first and second conductive materials 114, 119 may be the same, allowing use of the same process equipment for forming these materials. The first and second materials 114, 119 may also differ or partly differ from each other, allowing for an improved adjustment of the conductive materials to requirements at the first and second sides 112, 117.

The semiconductor device 100 further includes known elements specific to the semiconductor device 100. In one embodiment, the semiconductor device 100 is a diode and includes a p-doped anode and an n-doped cathode. In another embodiment, the semiconductor device 100 is a field effect transistor (FET) and at least includes a source region, a body region, a drain region, a gate dielectric and a gate electrode. According to an embodiment, the semiconductor device is a vertical semiconductor device including a first device terminal, e.g. source terminal or anode terminal at the first side 112 and a second device terminal, e.g. drain terminal or cathode terminal at the second side 117.

Formation of contact trenches at the first side 112 and the second side 117, i.e. at both sides 112, 117, allows for improving several aspects of semiconductor devices, e.g. power semiconductor devices such as metal oxide FETs (MOSFETs). As an example, compressive strain may be induced in a semiconductor body 105 made of or including silicon when filling the trench at least partly with an appropriate conductive material, e.g. Cu, or a combination of W and Cu, or a combination of W and Cu and barrier layer(s). In this case, compressive strain may be present not only in a channel region of a vertical FET but also in layer(s) below, e.g. an epitaxial layer and/or a semiconductor substrate. As an example, compressive strain may be distributed over a chip area via a corresponding pattern of the contact trenches, e.g., area(s) requiring a higher charge carrier mobility in a cell area and/or edge area may include a higher proportion of area of contact trenches. A current density distribution over the chip area may therefore be adjusted. As an example, increasing a current density capability in an edge area of a transistor device may be achieved with a proportional area of contact trenches in the edge area that is higher than in the cell area. The compressive strain, and thus a charge carrier mobility in silicon, can thereby be increased in the edge area.

In one embodiment, a width $w_2$ of the second contact trench 115 ranges between 0.1 μm and 10 μm. Likewise, a width $w_1$ of the first contact trench 110 may range between 0.1 μm and 2 μm.

In one embodiment, a depth $d_2$ of the second contact trench 115 ranges between 0.1 μm and 50 μm. Likewise, a depth $d_1$ of the first contact trench 115 ranges between 0.1 μm and 5 μm.

At the first side 112, a pattern of first contact trenches may be arranged. The first contact trenches or at least some of the first contact trenches may differ with regard to one or more of width, depth, taper, and contact trench geometry. For example, contact trench geometries include stripes, closed loops, and polygons. The first contact trenches or at least some the first contact trenches may also differ with regard to the first conductive material. As an example, the first contact material includes one or a combination of Ti, TiN, W, TiW, Ta, Cu, Al, AlSiCu, AlCu, doped semiconductor material other than the material of the semiconductor body 105, and carbon nanotubes. Further, the first contact trenches may additionally include diffusion barrier layer(s) and dielectrics, for example aluminum oxide, e.g. $Al_2O_3$ and/or aluminum nitride, e.g. AlN.

At the second side 117, a pattern of second contact trenches may be arranged. The second contact trenches or at least some of the first contact trenches may differ with regard to one or more of width, depth, taper, and contact trench geometry. For example, contact trench geometries include stripes, closed loops, and polygons. The second contact trenches or at least some the first contact trenches may also differ with regard to the first conductive material. As an example, the second contact material includes one or a combination of Ti, TiN, W, TiW, Ta, Cu, Al, AlSiCu, AlCu, doped semiconductor material other than the material of the semiconductor body 105, and carbon nanotubes. Further, the second contact trenches may additionally include diffusion barrier layer(s) and dielectrics, for example aluminum oxide, e.g. $Al_2O_3$ and/or aluminum nitride, e.g. AlN.

Apart from the beneficial effect of improved overall charge carrier mobility due to compressive strain induced by the first and second contact trenches 110, 115 at the first and second sides 112, 117, the first and second contact trenches 110, 115 also allow for an improved heat conductivity within the semiconductor body 105. As an example, heat generated in the semiconductor body 105 during operation of the semiconductor device 100 may be more efficiently dissipated via the first and second contact trenches 110, 115 and the first and second sides 112, 117. In case of improving heat dissipation within the semiconductor body 105, the first and second conductive materials 114, 119 may be appropriately chosen, i.e. with regard to the heat conductivity capabilities of the conductive materials.

Figure 2A:
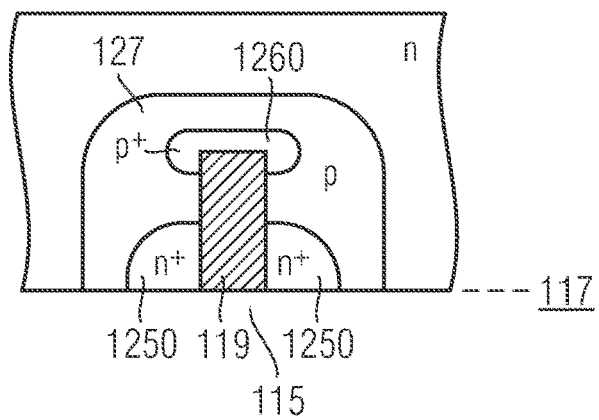
FIG. 2A is a schematic cross-sectional view of a part of the semiconductor body illustrated in FIG. 1 including n-doped and p-doped regions electrically coupled to the second contact trench according to one embodiment.

FIG. 2A is a schematic cross-sectional view of a part 120*b* of the semiconductor body 105 illustrated in FIG. 1 including n$^+$-doped and p$^+$-doped regions 1250, 1260 electrically coupled to the conductive material 119 of second contact trench 115 according to one embodiment. In the embodiment illustrated in FIG. 2A, the n$^+$-doped regions adjoin a first part of the second contact trench 115 that is closer to the second side 117 than a second part of the second trench 115 adjoining the p$^+$-doped region 1260. In other words, when defining a top side of the second trench 115 as being closer to the second side 117 than a bottom side of the second contact trench 115, the p$^+$-doped region 1260 adjoins a bottom side of the second contact trench 115. The n$^+$-doped and p$^+$-doped regions 1250, 1260 are embedded in a p-well 127 surrounded by an n-doped part of the semiconductor body 105. As an example, the p-well 127 may be a body region of an n-channel FET formed at the second side 117, the p$^+$-doped region 1260 may be a body contact region and the n$^+$-doped region 1250 may be a source region.

Figure 2B:
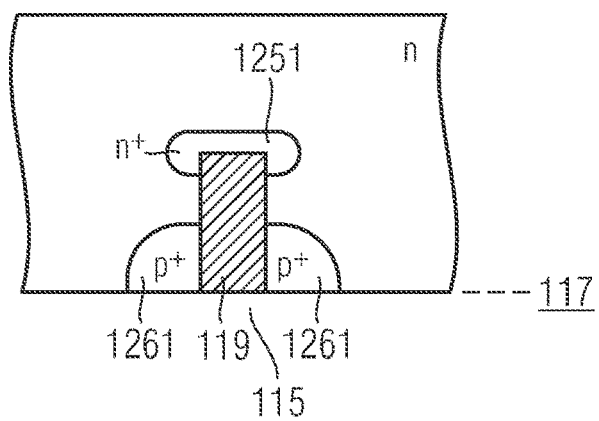
FIG. 2B is a schematic cross-sectional view of a part of the semiconductor body illustrated in FIG. 1 including n-doped and p-doped regions electrically coupled to the second contact trench according to another embodiment.

FIG. 2B is a schematic cross-sectional view of a part 120*b* of the semiconductor body 105 illustrated in FIG. 1 including n+-doped and p$^+$-doped regions 1251, 1261 electrically coupled to the conductive material 119 of second contact trench 115 according to another embodiment. In the embodiment illustrated in FIG. 2B, the p$^+$-doped regions 1251 adjoin a first part of the second contact trench 115 that is closer to the second side 117 than a second part of the second contact trench 115 adjoining the n-doped region 1251. In other words, when defining a top side of the second contact trench 115 as being closer to the second side 117 than a bottom side of the second contact trench 115, the n+-doped region 1251 adjoins a bottom side of the second contact trench 115. The n$^+$-doped and p$^+$-doped regions 1251, 1261 are surrounded by an n-doped part of the semiconductor body 105. As an example, the n-doped region 1251 may be a body contact region and the p-doped region 1261 may be a source region of a p-channel FET.

Figure 2C:
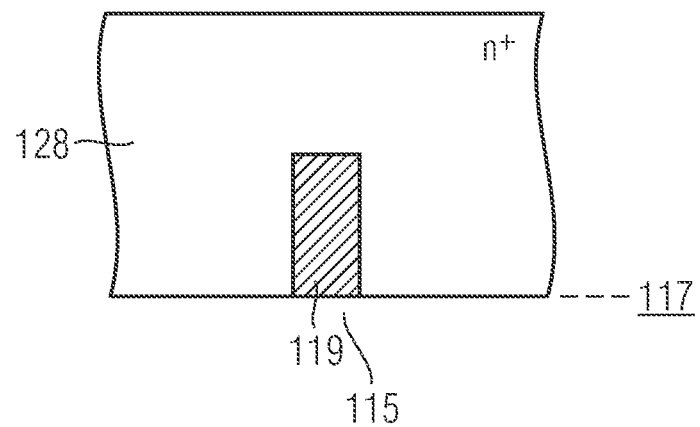
FIG. 2C is a schematic cross-sectional view of a part of the semiconductor body illustrated in FIG. 1 including an n+-doped region electrically coupled to the second contact trench according to one embodiment.

FIG. 2C is a schematic cross-sectional view of a part 120*b* of the semiconductor body 105 illustrated in FIG. 1 including an n$^+$-doped region 128 electrically coupled to the conductive material 119 of the second contact trench 115 according to one embodiment. The n$^+$-doped region 128 may be a part of a highly n-doped semiconductor substrate, e.g. a highly n-doped silicon substrate. As an example, the conductive material 119 in the second contact trench 115 may electrically couple a drain of a vertical FET at a backside of a semiconductor chip.

Figure 2D:
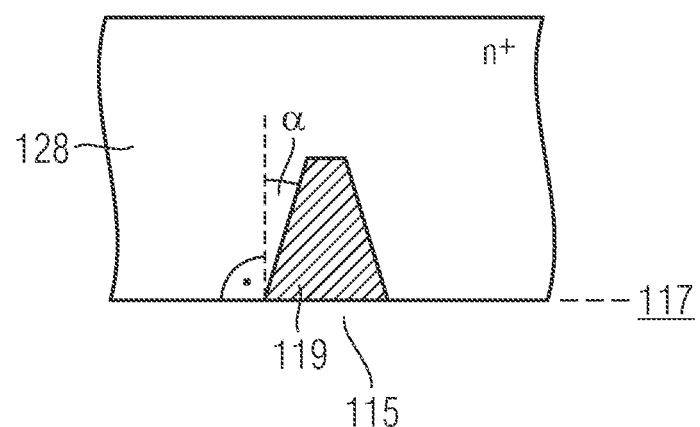
FIG. 2D is a schematic cross-sectional view of a part of the semiconductor body illustrated in FIG. 1 including the second contact trench with a sidewall angle α.

FIG. 2D is a schematic cross-sectional view of a part 120*b* of the semiconductor body 105 illustrated in FIG. 1 including the second contact trench 115 with a sidewall angle α relative to a direction perpendicular to the second side 117. According to an embodiment, the sidewall angle α ranges between 0° and 44°. An n$^+$-doped region 128 as part of the semiconductor body 105 is electrically coupled to the conductive material 119 in the second contact trench 115. Similar to the embodiment illustrated in FIG. 2C, the n$^+$-doped region 128 may be a part of a highly n-doped semiconductor substrate, e.g. a highly n-doped silicon substrate. As an example, the conductive material 119 in the second contact trench 115 may electrically couple a drain of a vertical FET at a backside of a semiconductor chip.

Figure 3:
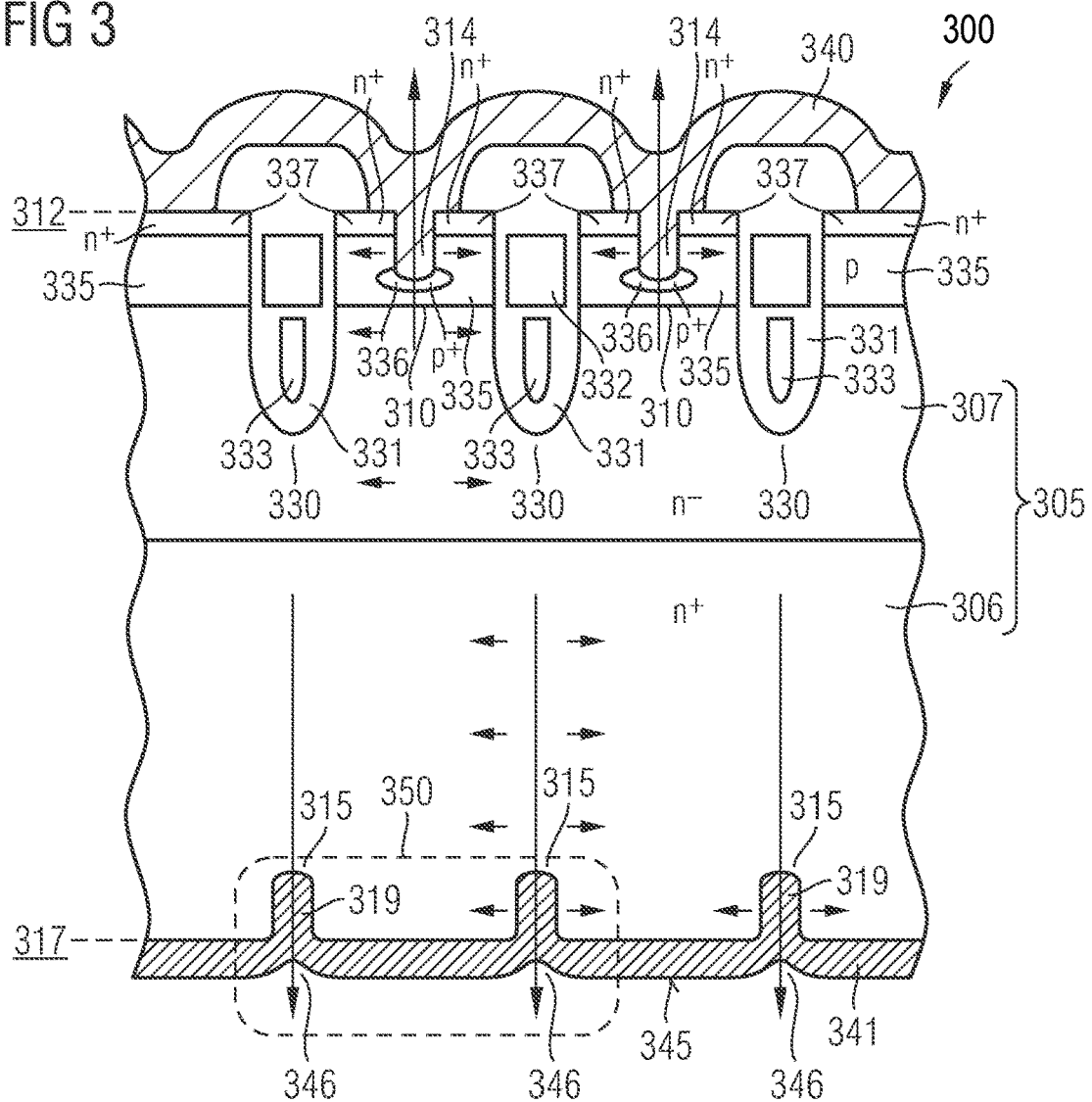
FIG. 3 is a schematic cross-sectional view of a portion of a vertical field effect transistor including a first contact trench at a first side of a semiconductor body and a second contact trench at a second side of the semiconductor body.

FIG. 3 is a schematic cross-sectional view of a portion of a vertical power FET 300 according to an embodiment. The vertical power FET 300 includes a semiconductor body 305, e.g. a monocrystalline silicon semiconductor body. The semiconductor body 305 includes an n$^+$-doped semiconductor substrate 306, e.g., an n$^+$-doped silicon substrate, and an n-doped semiconductor layer 307, e.g., an n-doped epitaxial silicon layer thereon. As an example, the concentration of n-doping and thickness of the semiconductor layer 307 may be chosen to meet requirements on blocking voltage capabilities and on-state resistance, for example.

The vertical power FET 300 further includes first contact trenches 310 at a first side 312, e.g. the front side of the semiconductor body 305 and second contact trenches 315 at a second side 317, e.g. the back side of the semiconductor body 305.

The first contact trenches 310 include a first conductive material 314 and the second contact trenches 315 include a second conductive material 319. The details on shape and material of the contact trenches and fillings described with reference to FIG. 1 apply to the first and second contact trenches 310, 315 and the first and second conductive materials 314, 319.

The vertical power FET 300 further includes gate trenches 330 extending from the first side 312 into the n-doped semiconductor layer 307. In each of the gate trenches 330 a dielectric structure 331 electrically insulates a gate electrode 332 from an optional field electrode 333. The gate electrode 332 and the field electrode may consist of or include a conductive material, e.g. a doped semiconductor material such as doped polysilicon and/or metal. The vertical power FET 300 may include none, one, two, three or even more optional field electrodes. A number of the optional field electrodes may depend on the voltage blocking requirements of the vertical power FET 300. The optional field electrodes may be alternately arranged along a vertical direction perpendicular to the first side 312. As an example, the field electrodes may be electrically coupled to a source potential of the vertical power FET 300. The dielectric structure 331 may include a number of dielectric materials or dielectric parts, e.g. a gate dielectric such as a gate oxide, a field dielectric such as a field oxide and a top dielectric such as a top oxide. A gate dielectric part of the dielectric structure 331 is located between the gate electrode 332 and a p-doped body region 335. The p-doped body region 335 is electrically coupled to the first conductive material 314 of the first contact trench 310 at the first side 312 via a p$^+$-doped body contact region 336. Likewise, an n$^+$-doped source region 337 is electrically coupled to the first conductive material 314 of the first contact trench 310 at the first side 312. In the vertical power FET 300, a conductivity of a channel region adjoining the gate dielectric between the source region 337 and the n-doped semiconductor layer 307 can be controlled via a voltage applied to the gate electrode 332.

The first conductive material 314 is electrically connected to a first conductive layer 340 interconnecting the source regions 337 and body regions 335 of different transistor cells of the vertical power FET 300. The first conductive material 314 and a material of the first conductive layer 340 may be the same or include common constituent parts, e.g. metal(s), metal alloy(s), metal silicide(s), doped semiconductor material(s) or a combination thereof. In other words, the first conductive material 314 and a material of the first conductive layer 340 together form a continuous conductive material. As an example, the first conductive material 314 and the first conductive layer 340 may be formed by a same manufacturing process, e.g. chemical vapor deposition (CVD), physical vapor deposition (PVD), atomic layer deposition (ALD), a sputter process, electroplating or a combination thereof.

In the vertical power FET 300 current flows between the first contact trenches 310 at the first side 312 and the second contact trenches 315 at the second side 317. The second contact trenches 315 and the second conductive material 319 at the second side 317 constitute a drain contact. The n⁺-doped semiconductor substrate 306 and the n-doped semiconductor layer 307 between the body regions 335 and the second side 317 form a drift zone of the vertical power FET 300. Similar to the first conductive material 314 and the conductive layer 340 at the first side 312, the second conductive material 319 is electrically connected to a second conductive layer 341. The second conductive material 319 and a material of the second conductive layer 341 may be the same or include common constituent parts, e.g. metal(s), metal alloy(s), metal silicide(s), doped semiconductor material(s) or a combination thereof. In other words, the second conductive material 319 and a material of the second conductive layer 341 together form a continuous conductive material. As an example, the first conductive material 319 and the second conductive layer 341 may be formed with a same manufacturing process, e.g. chemical vapor deposition (CVD), physical vapor deposition (PVD), atomic layer deposition (ALD), a sputter process, electroplating or a combination thereof.

In the embodiment illustrated in FIG. 3, the continuous conductive material including the second conductive material 319 and the second conductive layer 341 material cover a surface of the semiconductor body 305 at the second side 317. An outer surface 345 of the continuous conductive material at the second side 317 is predominantly flat and includes recesses 346 congruent with the second contact trenches 315. The recesses 346 provide a further benefit of the second contact trenches 315 as will be described with reference to FIG. 4.

Figure 4:
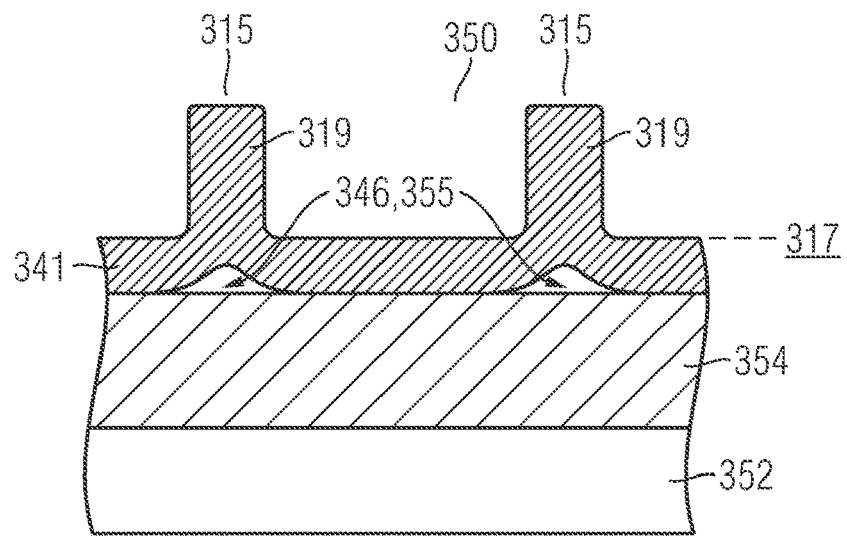
FIG. 4 is a schematic cross-sectional view of a portion of the vertical field effect transistor of FIG. 3 mounted to a carrier via the second side of the semiconductor body.

FIG. 4 is a schematic cross-sectional view of a portion 350 of the vertical field effect transistor 300 of FIG. 3 mounted to a carrier 352, e.g. lead frame via the second side 317 of the semiconductor body 305. When forming solder 354 between the continuous contact material at the second side 317 of the vertical field effect transistor 300 and the carrier 352, e.g. by a diffusion soldering process, recesses 344 remain as voids 355 between the continuous contact material and the carrier 352. Since the voids 355 are congruent with second contact trenches 315, arrangement of the voids 355, e.g. distance between voids 355 and lateral dimensions of the voids 355 can be adjusted by formation of the second contact trenches 319. This allows for a benefit with regard to a known process lacking a predefined pattern of voids at the second side 317. In the known process, voids having lateral dimensions of several 10 μm or even more than 50 μm result between a semiconductor body and a carrier from a soldering process, e.g. diffusion soldering. Voids having lateral dimensions of this size have a negative impact on dissipation of heat generated in the semiconductor body of the device. As an example, a risk of detrimental or even destructive current filaments increases with increasing lateral dimensions of voids. The second contact trenches 315 at the second side 317 and the voids 355 resulting thereof allow to improve dissipation of heat generated in the semiconductor body of the device and to counteract occurrence of detrimental or even destructive current filaments. The contact trenches at the first and/or second sides 312, 317 of the vertical field effect transistor 300 improve heat dissipation due to superior heat dissipation capabilities compared to a surrounding semiconductor body. A pattern of contact trenches may be adapted to achieve a homogeneous heat distribution within the semiconductor body, e.g. by concentrating contact trenches near bond wires. The heat distribution within the semiconductor body may be further influenced by adjusting a distribution, a density, a width and a depth of contact trenches in the semiconductor body. As an example, contact trenches may extend deep into the semiconductor body from a rear side and close to a pn junction at or near a front side. Heat generated at the pn junction may thereby be dissipated via the contact trenches to the rear side.

Figure 5:
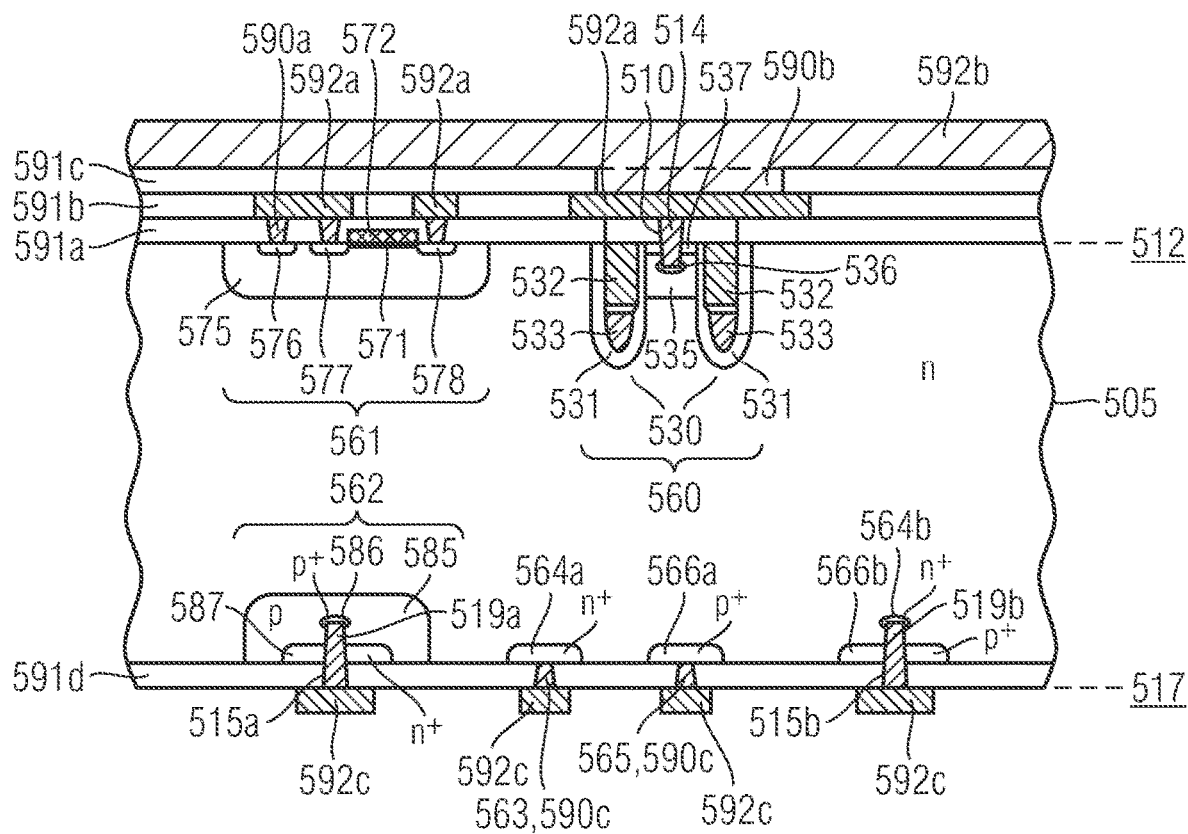
FIG. 5 is a schematic cross-sectional view of a portion of a semiconductor body including several semiconductor devices at opposing first and second sides and a first contact trench at a first side of a semiconductor body and a second contact trench at a second side of the semiconductor body.

FIG. 5 is a schematic cross-sectional view of a portion of an n-doped semiconductor body 505 including semiconductor devices at opposing first and second sides 512, 517 and a first contact trench 510 at the first side 512 of the semiconductor body 505 and second contact trenches 515a, 515b at the second side 517 of the semiconductor body 505.

Semiconductor devices and semiconductor regions are illustrated in FIG. 5 as examples. These examples include a vertical trench FET 560, a planar gate FET 561, a body structure 562 of a FET at the second side 517, a first contact 563 to an n⁺-doped semiconductor region 564 at the second side 517, a second contact 565 to a p⁺-doped semiconductor region 566 at the second side 517 and the second contact trench 515b including a second conductive material 519b electrically coupled to an n⁺-doped region 564b and a p⁺-doped region 566b adjoining the second contact trench 515b.

The vertical trench FET 560 further includes gate trenches 530. Each of the gate trenches 530 includes a dielectric structure 531. The dielectric structure 531 electrically isolates a gate electrode 532 and a field electrode 533 from the surrounding n-doped semiconductor body 505. A p-doped body region 535 and an n⁺-doped source region 537 are located between and adjoin the gate trenches 530. The p-doped body region is electrically coupled to the first conductive material 514 in the first contact trench 510 via a p⁺-doped body contact region 536.

The planar gate FET 561 includes a planar gate electrode 572, e.g. a polysilicon gate electrode electrically isolated from a p-doped body region 575 via a gate dielectric 571. The planar gate FET 561 further includes a p-doped body region 575, an n⁺-doped source region 577 and an n⁺-doped drain region 578. In the p-doped body region 575 a p⁺-doped body contact region 576 is formed.

The body structure 562 includes the second contact trench 515a filled with a second conductive material 519a. The second conductive material 519a is electrically coupled to a p-doped body region 585 and to an n⁺-doped source/drain region 587.

At the first side 512 a first contact pattern 590a surrounded by a first dielectric 591a, a first wiring pattern 592a surrounded by a second dielectric 591b, a second contact pattern 590b surrounded by a third dielectric 591c and a second wiring pattern 592b constitute or form part of a wiring area at the first side 512 configured to connect and interconnect the elements formed in the semiconductor body 505 at the first side 512. Some of the elements in the wiring area may be formed together, i.e. formed of a continuous and same material. As an example, the second wiring pattern 592b and the second contact pattern 590b may be processed together.

Similar to the wiring area at the first side 512, a third contact pattern 590c including the first and second contacts 563, 565, a fourth dielectric 591d surrounding the third contact pattern 591c and a third wiring pattern 592c constitute or form part of a wiring area at the second side 517.

Figure 6:
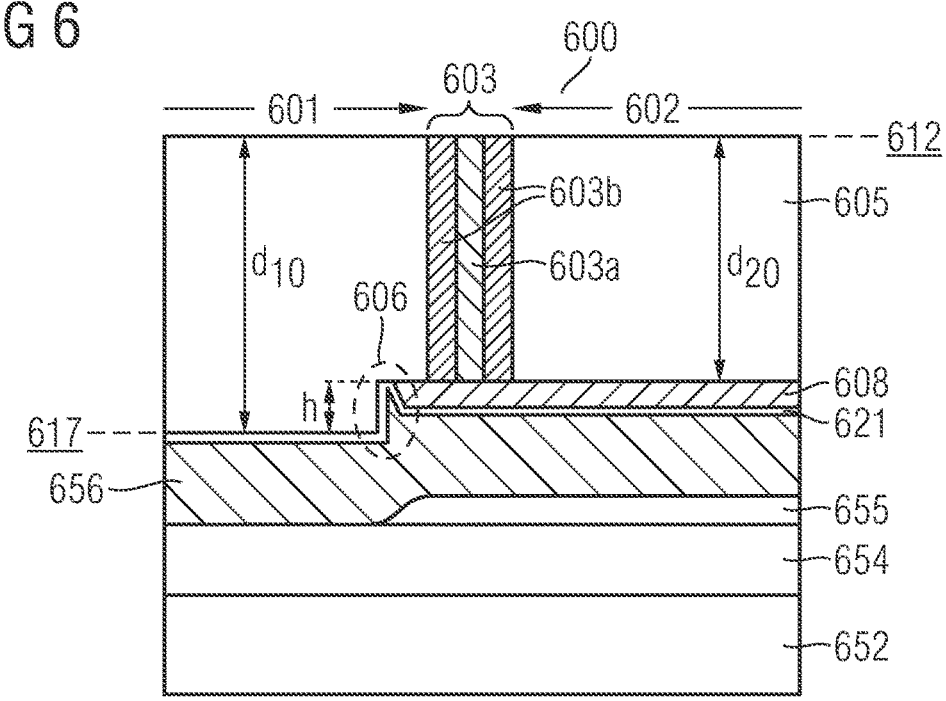
FIG. 6 is a schematic cross-sectional view of a portion of an integrated circuit including circuit blocks electrically insulated via a deep trench isolation.

FIG. 6 is a schematic cross-sectional view of a portion of an integrated circuit 600 including a first circuit block 601 and a second circuit block 602 electrically isolated via a deep trench isolation 603. The deep trench isolation 603 may include polysilicon 603a electrically isolated from the surrounding semiconductor body 605 via a dielectric 603b such as an oxide, e.g. $SiO_2$. According to another embodiment, the deep trench isolation 603 lacks conductive material. Each of the first and second circuit blocks 601 and 602 includes functional elements, e.g. n-doped and/or p-doped semiconductor regions, dielectrics, or electrodes formed in or on a semiconductor body 605. The first circuit block is a power device, e.g. a power FET or a power double-diffused metal oxide semiconductor FET (DMOSFET) which may be of single or multi-channel type, e.g. double channel type. In case of multi-channel type FETs, a common drain may be at a second side 617, e.g. back side and separate sources may be at a first side 612, e.g. front side. The second circuit block 602 includes analog and/or digital circuits, e.g. gate drivers.

The semiconductor body 605 includes a step 606 along a surface at the second side 617. A thickness $d_{20}$ of the second circuit block 602 is smaller than a thickness $d_{10}$ of the first circuit block 601. A height h of the step 606 may range between 0.2 µm and 10 µm. A dielectric 608 at the second side 617 further electrically isolates the second circuit block 602.

An optional seed layer 621 including e.g. Ti and TiWCu or a combination thereof and a back side metal 656 including e.g. Cu, Sn, Ag or a combination thereof are electrically connected to the semiconductor body 605 of the first circuit block 601.

The semiconductor body 605 is mounted to a carrier 652, e.g. lead frame via the second side 617 of the semiconductor body 605. When forming solder 654 between the back side metal 656 at the second side 617 and the carrier 652, e.g. by a diffusion soldering process recesses a void 655 remains between the back side metal 656 and the carrier 652 in the second circuit block 602 which is thermally inactive other than the electrically and thermally active first circuit block 601. Thus, the void 655 is fixed to an area of the thermally inactive second circuit block 602 counteracting formation of voids in the thermally and electrically active first circuit block 601. This allows for improving the electrical and thermal coupling between the first circuit block 601 and the carrier 652.

FIG. 7 is a simplified flow chart of a method of manufacturing an integrated circuit according to an embodiment.

Process feature S700 includes forming a first circuit part and a second circuit part in a semiconductor body including a first side and a second side opposite to the first side.

Process feature S710 includes forming a deep trench isolation in the semiconductor body between the first circuit part and the second circuit part.

Process feature S720 includes forming a step in the semiconductor body along a surface at the second side.

Process feature S730 includes attaching the semiconductor body to a carrier via the second side.

In one embodiment, forming the step along the surface at the second side includes forming a mask over at least part of the semiconductor body in the first circuit part at the second side, and removing at least part of the semiconductor body in the second circuit part from the second side.

In another embodiment, forming the deep trench isolation in the semiconductor body between the first circuit part and the second circuit part includes a) etching a deep trench into the semiconductor body from the first side, b) lining the deep trench with an insulating layer, c) filling the trench with a conductive material and d) removing the semiconductor body from the second side up to a bottom side of the deep trench.

Figure 8A:
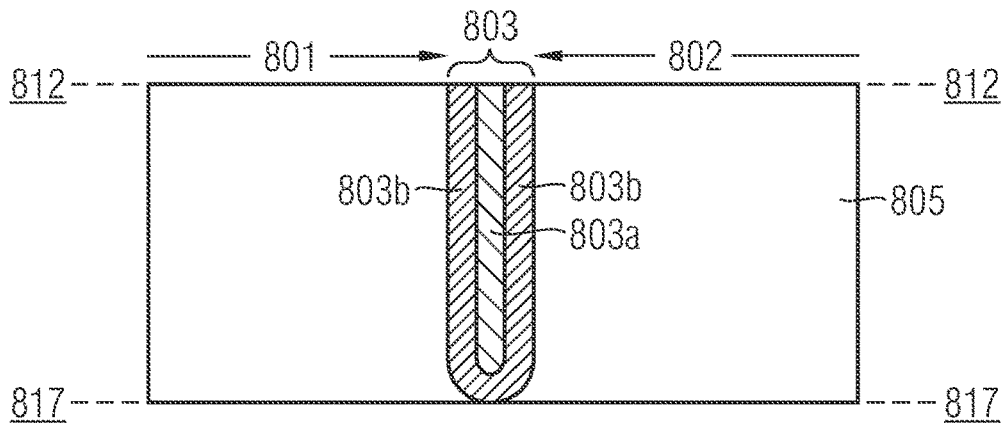
FIG. 8A is a schematic cross-sectional view of a semiconductor body after forming a deep trench isolation at a first side between a first circuit part and a second circuit part and removing the semiconductor body from a second side opposite to the first side.

FIG. 8A is a schematic cross-sectional view of a semiconductor body 805, e.g. a semiconductor substrate including optional semiconductor layer(s) thereon after forming a deep trench isolation 803 at a first side 812 between a first circuit part 801 and a second circuit part 802. Processing the semiconductor body 805 up to the status as illustrated in FIG. 8A may further include the following processes.

The deep trench isolation 803 may be formed by forming a hard mask pattern on the first side 812. Then, a deep trench may be etched into the semiconductor body 805, e.g. by a dry etch process such as plasma etching. Thereafter, a dielectric, e.g. a field oxide may be formed in the trench, e.g. by conformal deposition using an appropriate method such as low pressure chemical vapor deposition (LPCVD). The trench may then be filled up with conductive material(s), e.g. doped polysilicon and/or metal. Known processes follow to form circuit elements of the first and second and further optional circuit blocks. These known processes include processes such as ion implantation, etching, and layer deposition. Formation of a wiring area including wiring patterns, e.g. conductive patterns and interlayer dielectrics follows. After attaching the semiconductor body 805 via the first side 812 to a carrier, the semiconductor body is then removed from a second side 817 opposite to the first side 812 up to a bottom side of the trenches. As an example, the dielectric 803b may trigger an etch stop signal.

Figure 8B:
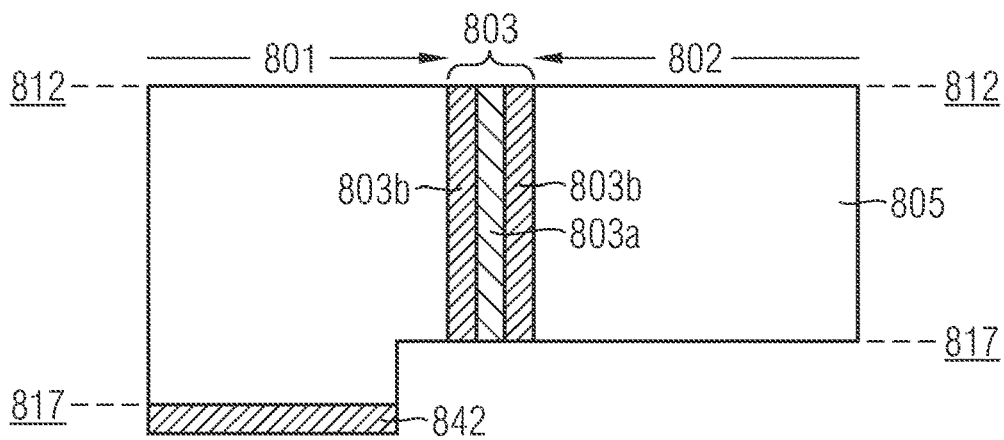
FIG. 8B is a schematic cross-sectional view of the semiconductor body of FIG. 8A after removing a part of the semiconductor body from the second side in the second circuit part.

FIG. 8B is a schematic cross-sectional view of the semiconductor body of FIG. 8A after removing a part of the semiconductor body 805 from the second side 817 in the second circuit part 802. Removing of the part of the semiconductor body 805 may be carried out by formation of an etch mask 842, e.g. resin mask and an etch process such as physical plasma etching.

Figure 8C:
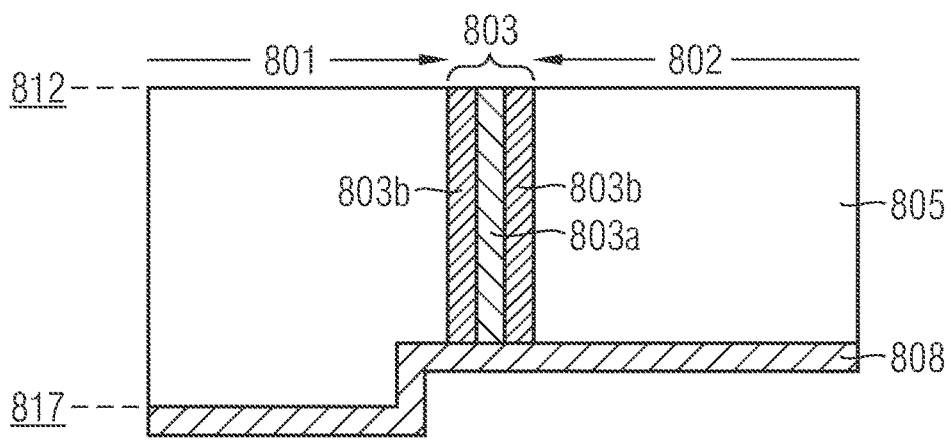
FIG. 8C is a schematic cross-sectional view of the semiconductor body of FIG. 8B after forming a dielectric layer adjoining the semiconductor body at the second side in the first and second circuit parts.

FIG. 8C is a schematic cross-sectional view of the semiconductor body 805 of FIG. 8B after removing the etch mask 842 and forming a dielectric 808 adjoining the semiconductor body 805 at the second side 817. As an example, the dielectric 808 may be and oxide, e.g. $SiO_2$ or nitride, e.g. $Si_3N_4$ or a combination thereof.

Figure 8D:
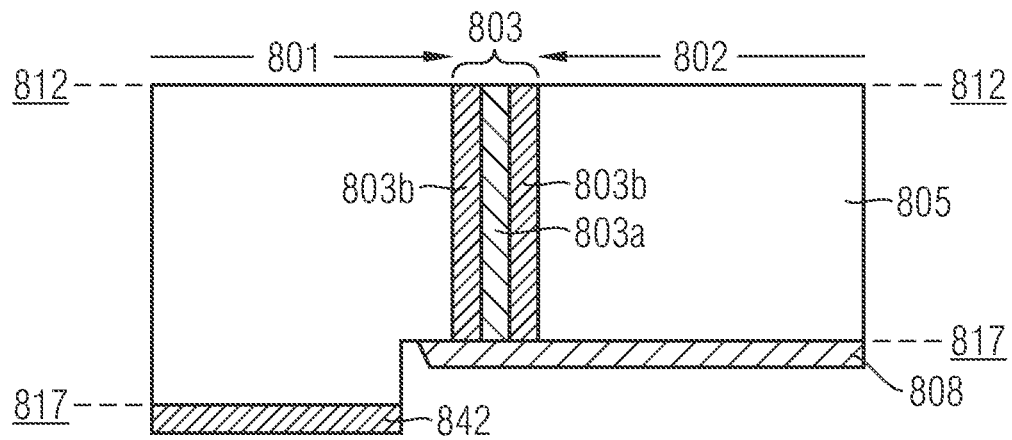
FIG. 8D is a schematic cross-sectional view of the semiconductor body of FIG. 8C after removing the dielectric layer in the first circuit part at the second side.

FIG. 8D is a schematic cross-sectional view of the semiconductor body 805 of FIG. 8C after removing a part of the dielectric 808. The dielectric 808 remains in the second circuit part 802 at the second side and is removed from a main area, i.e. more than 75% or, more than 90% of the first circuit part 801 at the second side 817. As an example, the dielectric 808 may be removed from the second side 817 by an etch process and/or by chemical mechanical polishing (CMP).

Further processes follow and result in an integrated circuit as illustrated in FIG. 6, e.g. formation of an optional seed layer at the second side 817, formation of a back side metal, and mounting of the semiconductor body to a carrier such as a lead frame.

Figure 9:
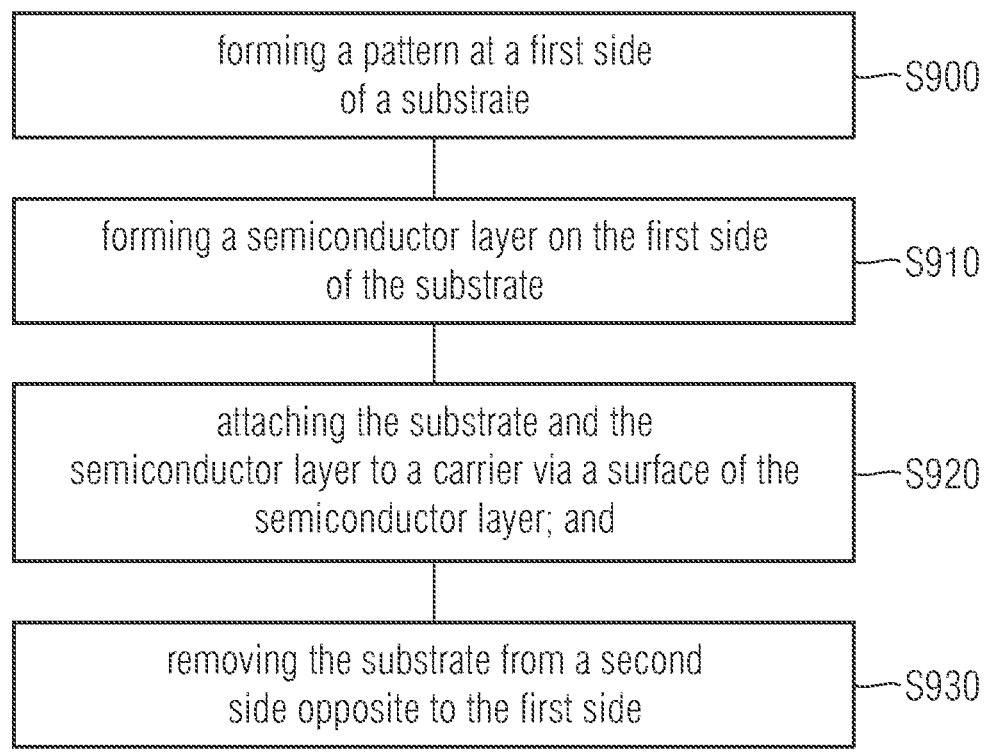
FIG. 9 is a simplified flow chart of a method of manufacturing a semiconductor body according to an embodiment.

FIG. 9 is a simplified flow chart of a method of manufacturing a semiconductor body according to an embodiment.

Process feature S900 includes forming a pattern at a first side of a substrate.

Process feature S910 includes forming a semiconductor layer on the first side of the substrate.

Process feature S920 includes attaching the substrate and the semiconductor layer to a carrier via a surface of the semiconductor layer.

Process feature S930 includes removing the substrate from a second side opposite to the first side.

The above method allows for a simple manufacturing of semiconductor devices and integrated circuits including a semiconductor body with a patterned back side. Semiconductor devices and integrated circuits described in the embodiments above may include the above process features. As an example, complex patterning/adjustment from a front side to a back side and high temperature budgets after front side processing and wafer thinning can be avoided.

Figure 10A:
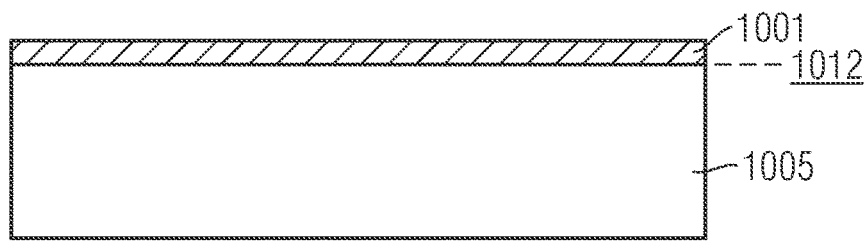
FIG. 10A is a schematic cross-sectional view of a substrate after forming a layer on a first side of the substrate.

FIG. 10A is a schematic cross-sectional view of a substrate 1005, e.g. a semiconductor substrate, after forming a layer 1001 on a first side 1012. The layer 1001 may be formed by a deposition technique, e.g. chemical vapor deposition (CVD). The layer 1001 may be of the same material than the material of the substrate 1005 or of a material other than the material of the substrate 1005. As an example, the layer 1001 may be a dielectric layer. As a further example, the layer 1001 may include one layer or a layer stack of materials such as oxides, e.g. $SiO_2$ and nitrides, e.g. $Si_3N_4$. As a further example, the layer 1001 may be formed by thermal oxidation of a surface of the substrate 1005 resulting in a thermally grown oxide, e.g. $SiO_2$ in the case of a silicon semiconductor substrate 1005.

Figure 10B:
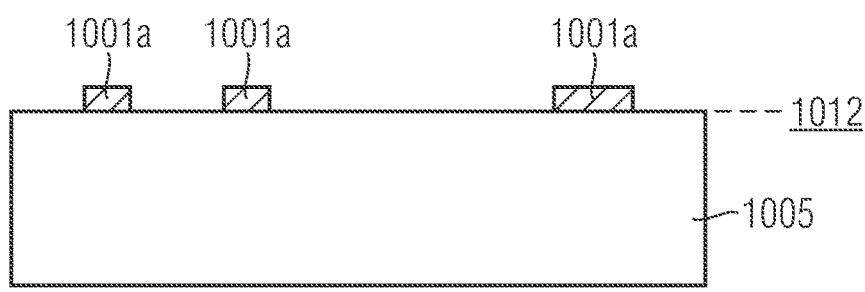
FIG. 10B is a schematic cross-sectional view of the substrate of FIG. 10A after patterning the layer leading to a patterned layer.

FIG. 10B is a schematic cross-sectional view of the substrate 1005 of FIG. 10A after patterning the layer 1001 leading to a patterned layer 1001a. Patterning of the layer 1001 may be carried out by a lithographic process, e.g. covering the layer 1001 with a lithographically patterned mask, e.g. resist or hard mask and selective removal of the layer parts via openings of the patterned mask. The patterned layer 1001a illustrated in FIG. 10B may correspond to a pattern of contact trenches and/or voids to be formed by further processes. These contact trenches and voids allow for various technical benefits as described in the embodiments above.

Figure 10C:
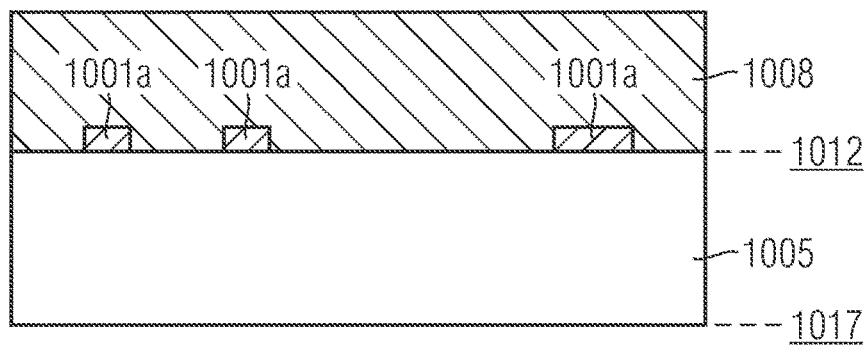
FIG. 10C is a schematic cross-sectional view of the substrate of FIG. 10B after forming a semiconductor layer on the first side of the substrate.

FIG. 10C is a schematic cross-sectional view of the substrate 1005 of FIG. 10B after forming a semiconductor layer 1008 on the first side 1012 of the substrate 1005. The semiconductor layer 1008 may be formed by chemical vapor deposition (CVD), e.g. by selective epitaxial growth in case of a semiconductor substrate and a dielectric patterned layer. Doping concentration and thickness of the semiconductor layer may be adjusted to voltage blocking requirements and/or on-state resistance requirements of a semiconductor device to be manufactured in the semiconductor layer 1008.

Figure 10D:
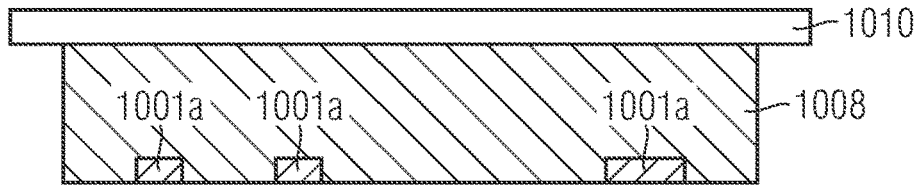
FIG. 10D is a schematic cross-sectional view of the semiconductor layer of FIG. 10O after attaching the substrate and the semiconductor layer to a carrier and after removing the substrate.

FIG. 10D is a schematic cross-sectional view of the semiconductor layer 1008 of FIG. 10C after attaching the substrate 1005 and the semiconductor layer 1008 to a carrier, e.g. a glass carrier or ceramic carrier via a surface of the semiconductor layer 1008. The substrate 1005 is removed from a second side 1017 (see FIG. 10C) opposite to the first side 1012. As an example, the substrate 1005 may be thinned by an etch process, by grinding or a combination thereof. As an example, etching the substrate 1005 may be terminated when reaching the patterned layer 1001a. The patterned layer 1001a may trigger an etch stop signal being a change in a characteristic monitored during etching or grinding.

Figure 10E:
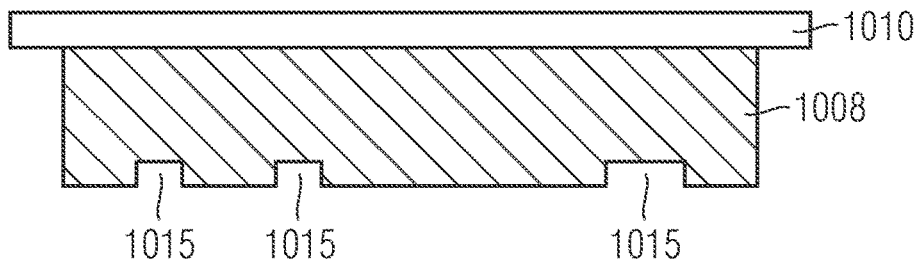
FIG. 10E is a schematic cross-sectional view of the semiconductor layer of FIG. 10D after removing the patterned layer.

FIG. 10E is a schematic cross-sectional view of the semiconductor layer 1008 of FIG. 10D after removing the patterned layer 1001a. As an example, the patterned layer 1001a may be removed by an etch process, e.g. by hydrofluoric acid (HF) when removing $SiO_2$. After removal of the patterned layer 1001a, a recess pattern 1015 congruent with the patterned layer 1001a remains. The recess pattern 1015 may be further processed to realize any desired back side pattern of a semiconductor body. Examples of patterns and the resulting technical benefits are described in the embodiments above and include contact trench patterns and void patterns or any combination thereof.

Before attaching the semiconductor layer 1008 to the carrier 1010, known process flows, e.g. ion implantation, lithography, etching, and layer deposition may be carried out to form semiconductor devices and circuit elements, e.g. FETs, insulated gate bipolar transistors (IGBTs), diodes, bipolar transistors, resistors, and capacitors in the semiconductor layer 1008.

In one embodiment (not shown), the patterned layer may be formed by patterning the substrate at the first side, e.g. by forming recesses in the surface of the substrate at the first side. The recesses my be formed by masked etching the first side of the substrate or by processing the first side of the substrate with a laser beam.

Figure 11A:
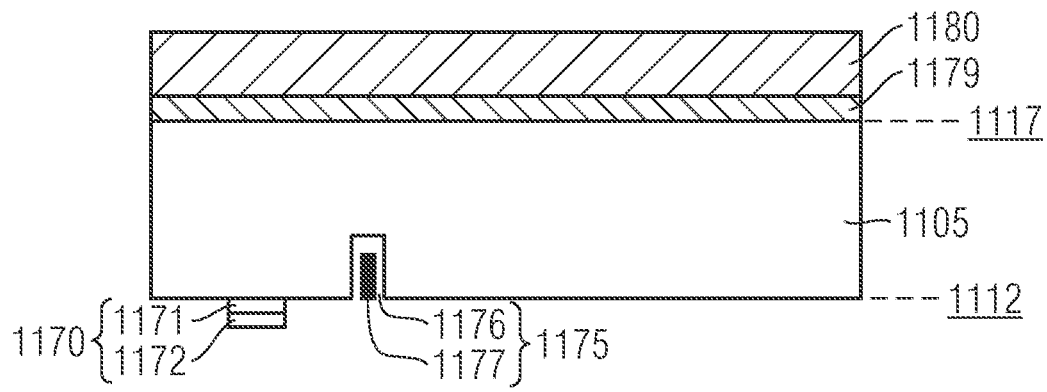
FIGS. 11A to 11D and 12A to 12C illustrate schematic cross-sectional views of different embodiments of manufacturing a semiconductor device including a conductive layer pattern at a rear side of a semiconductor body.

FIG. 11A is a schematic cross-sectional view of a semiconductor body 1105, e.g. a semiconductor substrate including one or several semiconductor layers thereon. The semiconductor body includes at least one of a planar gate structure 1170 including a planar gate dielectric 1171 and a planar gate electrode 1172 and a trench gate structure 1175 including a trench gate dielectric 1176 and a trench gate electrode 1177 at a first side 1112, e.g. a front side of the semiconductor body 1105.

At least one conductive layer 1179 is formed at a second side 1117, e.g. a rear side of the semiconductor body 1105. The at least one conductive layer 1179 may include one or any combination of Ag, Ti, W, TiN, Cu, Al, Sn, Ag. According to one embodiment, an outermost layer of the at least one conductive layer 1179 is a noble metal. Formation of the at least one conductive layer 1179 may include any suitable process including physical vapor deposition (PVD), chemical vapor deposition (CVD) and electro-chemical deposition (ECD).

A second conductive layer 1180 is formed on the at least one first conductive layer 1179. According to one embodiment, the second conductive layer 1180 is formed as a copper layer, e.g. by ECD. A thickness of the second conductive layer 1180 is adjusted between 0.5 µm and 50 µm. According to an embodiment, a material of the at least one conductive layer adjoining the conductive layer pattern is selectively etchable with respect to a material of the first conductive layer. For example, the material of the at least one conductive layer adjoining the conductive layer pattern is a noble metal and the material of the second conductive layer is Cu.

Figure 11B:
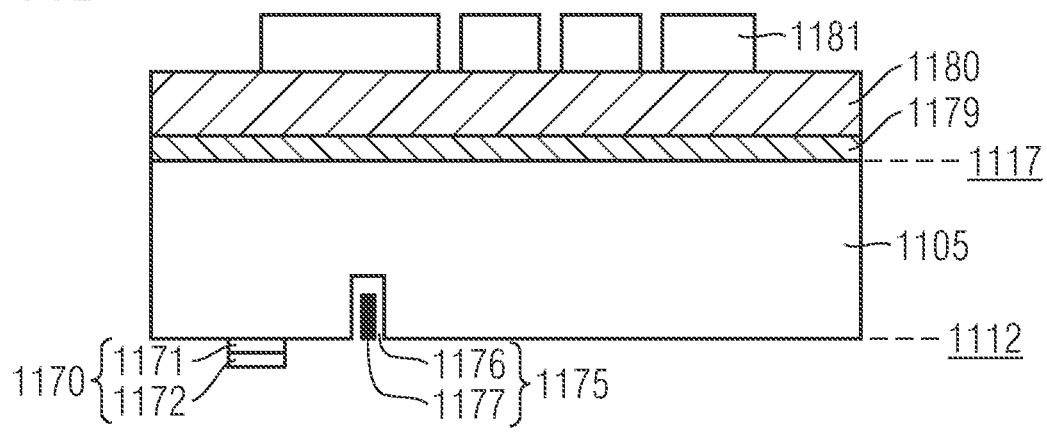

Referring to the schematic cross-sectional view of the semiconductor body 1105 illustrated in FIG. 11B, an etch mask pattern 1181 is formed on the second conductive layer 1180, e.g. a lithographically patterned resist layer or a lithographically patterned hard mask.

Figure 11C:
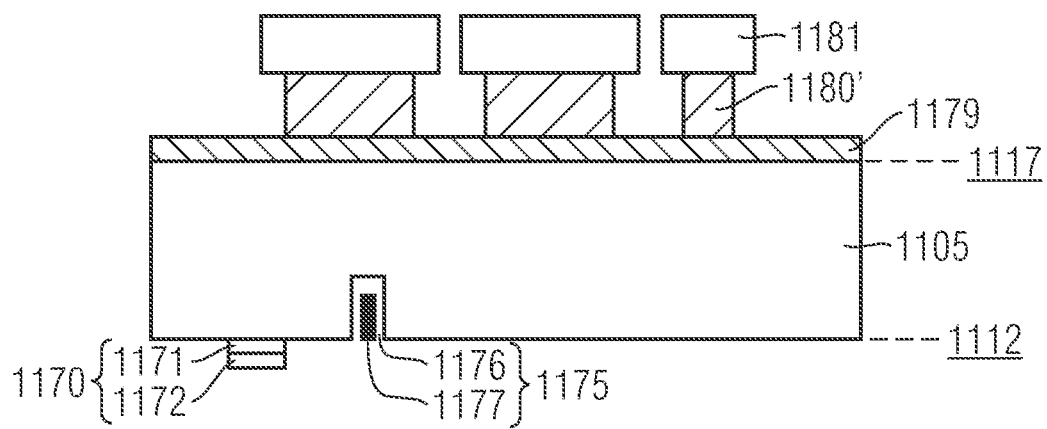

Referring to the schematic cross-sectional view of the semiconductor body 1105 illustrated in FIG. 11C, the second conductive layer 1180 is selectively etched with respect to an outermost material of the at least one first conductive material 1179, e.g. by isotropic etching such as wet etching or by anisotropic etching. A remaining part of the second conductive layer 1180 constitutes a conductive layer pattern 1180'.

Figure 11D:
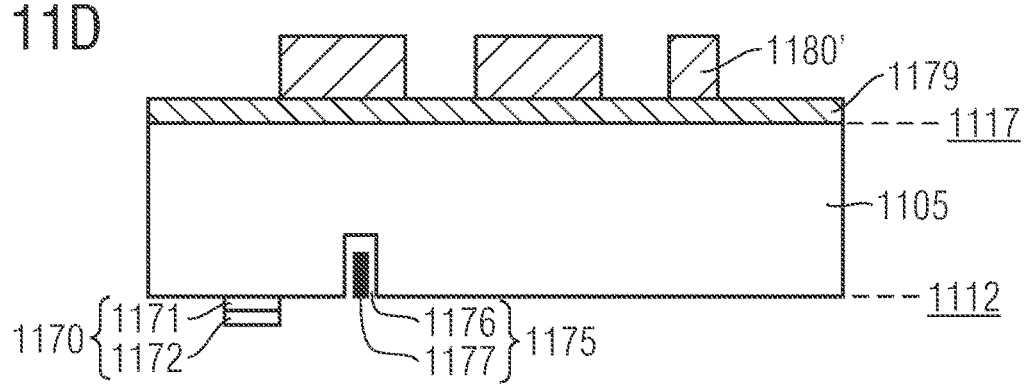

Referring to the schematic cross-sectional view of the semiconductor body 1105 illustrated in FIG. 11D, the etch mask pattern 1181 is removed, e.g. by etching, resist stripping, chemical mechanical polishing (CMP) or a combination thereof. Similar to the embodiment described with reference to FIGS. 6 and FIGS. 8A to 8D, the semiconductor body 1105 may be mounted to a carrier, e.g. a lead frame, via the second side 1117 of the semiconductor body 1105. Voids are included in the conductive layer pattern 1180' between the carrier and the at least one first conductive layer 1179. The conductive layer pattern 1180' may be appropriately designed to locate the voids in areas of the semiconductor body 1105 which are thermally inactive, i.e., areas other than electrically and thermally active parts of the semiconductor body 1105 where a material of the conductive layer pattern 1180' is present. Thus, the voids can be fixed to an area of a thermally inactive circuit block, e.g. a circuit block other than a power device, thereby counteracting formation of voids in a thermally and electrically active other circuit block.

Figure 12A:
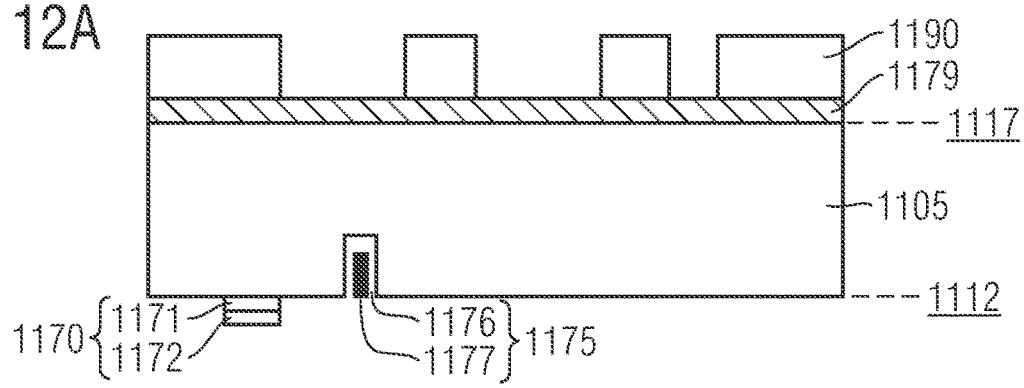
Figure 12B:
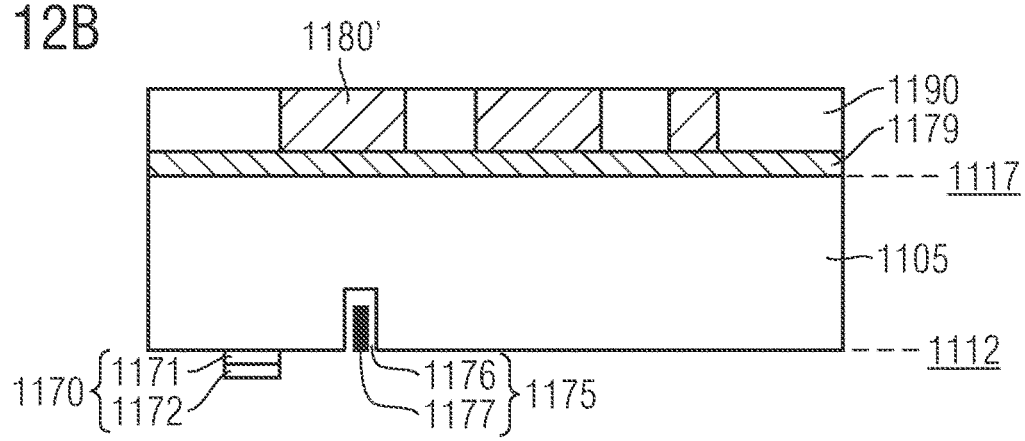

Similar benefits can be achieved by the process illustrated in FIGS. 12A and 12B. Since the process illustrated in FIGS. 12A and 12B has a number of process elements similar to the process illustrated in FIGS. 11A to 11D, the following description will refer to differences in these processes, and reference is drawn to the description related to FIGS. 11A to 11D as regards similarities.

Referring to the schematic cross-sectional view of the semiconductor body 1105 illustrated in FIG. 12A, a mask pattern 1190 is formed on at least one conductive layer 1179. According to an embodiment, the mask pattern 1190 includes a material that can be selectively removed with respect to a material of the conductive layer pattern 1180' formed in openings of the mask pattern 1190 (c.f. FIG. 12B).

Figure 12C:
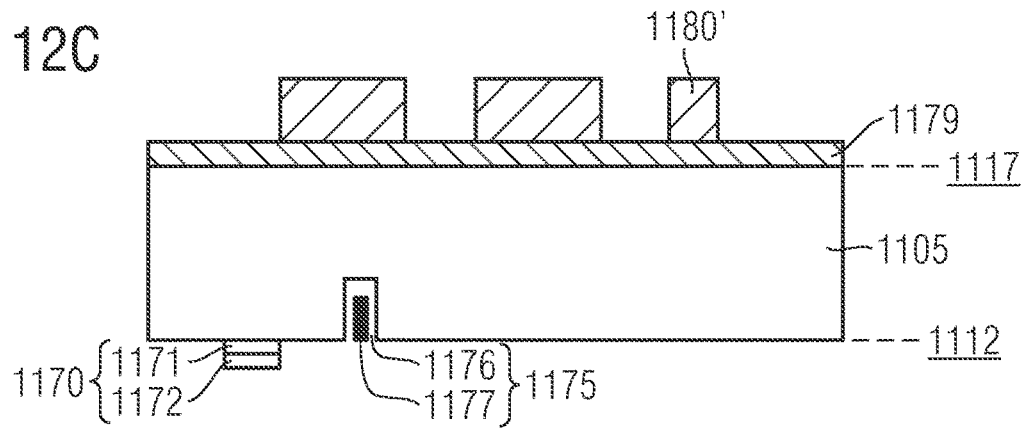

Referring to the schematic cross-sectional view of the semiconductor body 1105 illustrated in FIG. 12C, the mask pattern 1190 is selectively removed with respect to the conductive layer pattern 1180', e.g. by etching, resist stripping or a combination thereof.

Features of the above described embodiments may be combined in any way unless they do not exclude each other. The specific conductivity types used to describe the above embodiments are examples and likewise apply with complementary conductivity types.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor body comprising:
    forming a pattern at a first side of a substrate;
    forming a semiconductor layer on the first side of the substrate;
    attaching the substrate and the semiconductor layer to a carrier via a surface of the semiconductor layer; and
    removing the substrate from a second side opposite to the first side.

2. The method of claim 1, wherein removing the substrate includes thinning the substrate from the second side to a level of the pattern.

3. The method of claim 1, further comprising:
    removing the pattern resulting in recesses in the semiconductor layer.

4. The method of claim 3, further comprising:
    forming a conductive material in the recesses.

5. The method of claim 3, further comprising:
    implanting at least one of n-type and p-type dopants into the semiconductor layer via a surface of the recesses.

6. The method of claim 1, wherein forming the pattern includes
    forming an oxide pattern on a first side of a crystalline silicon semiconductor substrate by lithographic patterning of an oxide layer.

7. The method of claim 1, wherein forming the semiconductor layer includes
    forming the semiconductor layer by selective epitaxial growth.

8. The method of claim 1, wherein the dielectric pattern includes at least one of parallel stripes, a closed loop, and an iterative pattern of dielectric islands.

9. The method of claim 1, wherein the forming of the pattern includes forming recesses in the surface of the substrate at the first side.

10. The method of claim 1, wherein the forming of the semiconductor layer includes forming the semiconductor layer by chemical vapor deposition.

11. The method of claim 1, wherein the forming of the pattern includes a lithographic patterning of the substrate at the first side.

12. The method of claim 1, wherein the semiconductor layer covers the pattern and parts of the substrate beside the pattern.

* * * * *